(12) United States Patent
Doris et al.

(10) Patent No.: US 10,389,356 B2
(45) Date of Patent: *Aug. 20, 2019

(54) RESONANT VIRTUAL SUPPLY BOOSTER FOR SYNCHRONOUS LOGIC CIRCUITS AND OTHER CIRCUITS WITH USE OF ON-CHIP INTEGRATED MAGNETIC INDUCTOR

(71) Applicant: INTERNATIONAL BUSINESS MACHINES CORPORATION, Armonk, NY (US)

(72) Inventors: Bruce B. Doris, Slingerlands, NY (US); Rajiv V. Joshi, Yorktown Heights, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/962,510

(22) Filed: Apr. 25, 2018

(65) Prior Publication Data

US 2018/0337679 A1  Nov. 22, 2018

Related U.S. Application Data

(62) Division of application No. 15/597,978, filed on May 17, 2017, now Pat. No. 10,003,337.

(51) Int. Cl.
*H03K 19/00* (2006.01)
*H01L 27/092* (2006.01)
(Continued)

(52) U.S. Cl.
CPC . *H03K 19/0013* (2013.01); *H01L 21/823821* (2013.01); *H01L 23/5286* (2013.01);
(Continued)

(58) Field of Classification Search
CPC ........ H03K 19/0013; H03K 19/017509; H01L 21/823821; H01L 23/5286; H01L 27/0924; H01L 28/10; H01L 28/40
See application file for complete search history.

(56) References Cited

U.S. PATENT DOCUMENTS

2009/0066157 A1\* 3/2009 Tarng ...................... H03B 5/04
307/31
2014/0025948 A1 1/2014 Bestler et al.
(Continued)

FOREIGN PATENT DOCUMENTS

CN 103199593 A 7/2013
JP 2011049424 A 3/2011

OTHER PUBLICATIONS

Joshi et al., "A Floating-Body Dynamic Supply Boosting Technique for Low-Voltage PD/SOI CMOS SRAM", ISLPED'07, Aug. 2007, pp. 8-13.
(Continued)

*Primary Examiner* — Seokjin Kim
(74) *Attorney, Agent, or Firm* — Tutunjian & Bitetto, P.C.; Vazken Alexanian

(57) ABSTRACT

A circuit and method are provided. The circuit and method are for providing a supply voltage. The circuit includes a first transistor and a second transistor, coupled to a static power supply that supplies a constant power supply voltage. The circuit further includes a magnetic inductor having a first terminal connected to a common node between the first transistor and the second transistor and a second terminal connected to the dynamic internal power supply node, to supply a dynamic internal power supply node with a boosted voltage relative to the constant power supply voltage by resonating with at least one capacitance coupled to the dynamic internal power supply node.

20 Claims, 19 Drawing Sheets

(51) Int. Cl.
  *H01L 49/02*      (2006.01)
  *H01L 23/528*     (2006.01)
  *H01L 21/8238*    (2006.01)
  *H03K 19/0175*    (2006.01)

(52) U.S. Cl.
  CPC .......... *H01L 27/0924* (2013.01); *H01L 28/10* (2013.01); *H01L 28/40* (2013.01); *H03K 19/017509* (2013.01)

(56) References Cited

U.S. PATENT DOCUMENTS

| | | |
|---|---|---|
| 2014/0104952 A1 | 4/2014 | Takeuchi et al. |
| 2014/0298068 A1 | 10/2014 | Kosonocky et al. |
| 2015/0003174 A1 | 1/2015 | Joshi et al. |
| 2015/0177823 A1 | 6/2015 | Maiyuran et al. |
| 2016/0028310 A1 | 1/2016 | Jeffries |
| 2016/0079848 A1 | 3/2016 | Teno |
| 2017/0024949 A1 | 1/2017 | Johnson et al. |
| 2017/0025948 A1 | 1/2017 | Joshi et al. |

OTHER PUBLICATIONS

List of IBM Patents or Patent Applications Treated as Related dated Feb. 15, 2018, 2 pages.
List of IBM Patents or Patent Applications Treated as Related dated Apr. 25, 2018, 2 pages.
International Search Report issued in PCTIB2018053334 dated Aug. 15, 2018, 9 pages.
Office Action dated Jun. 15, 2018 for U.S. Appl. No. 15/897,924.

\* cited by examiner

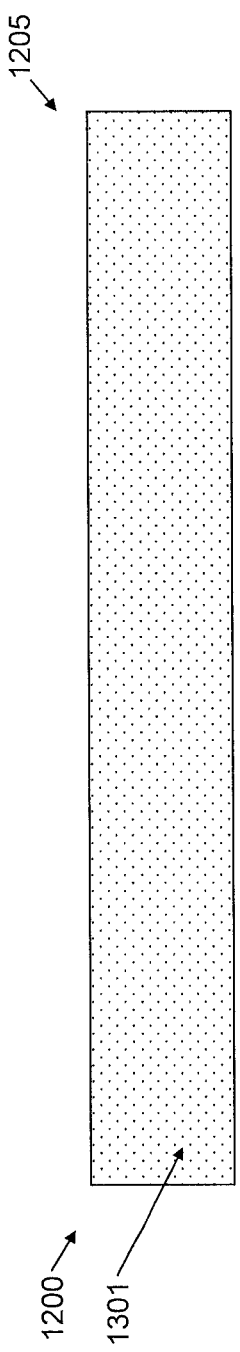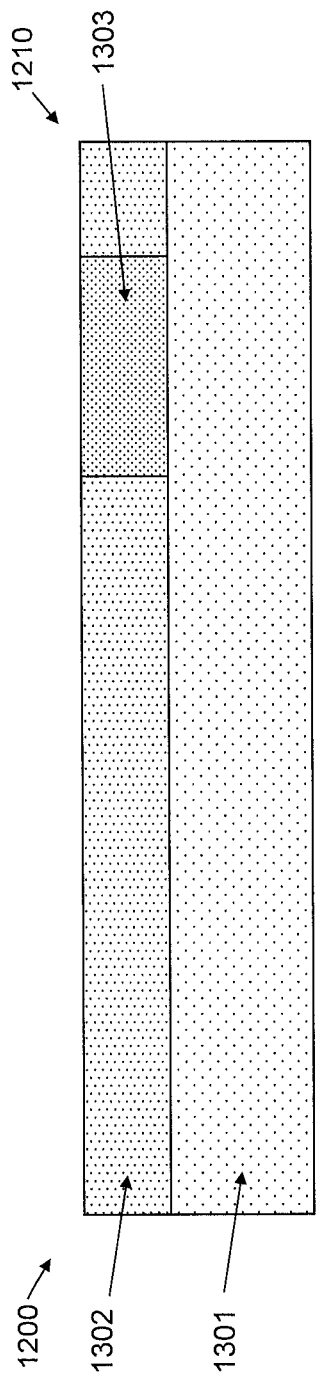
FIG. 12
FIG. 13

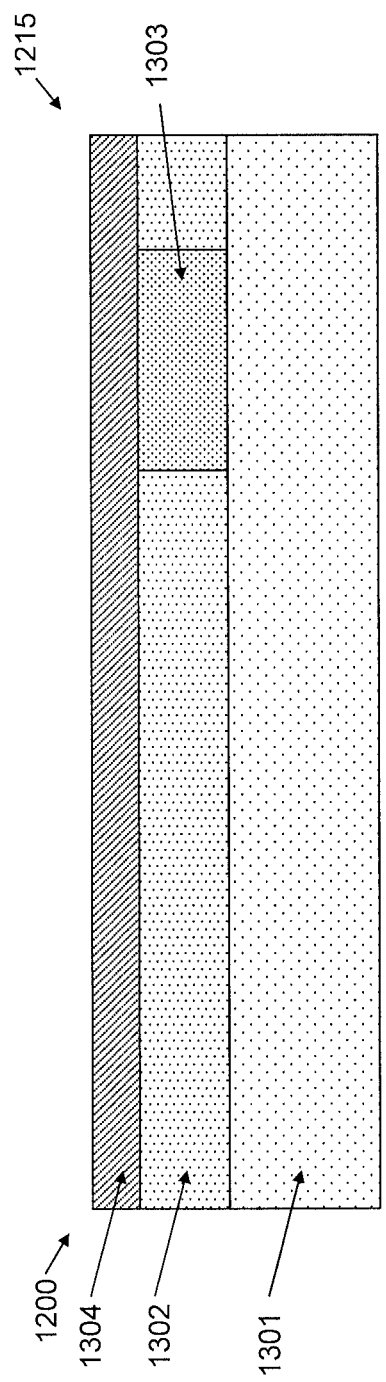
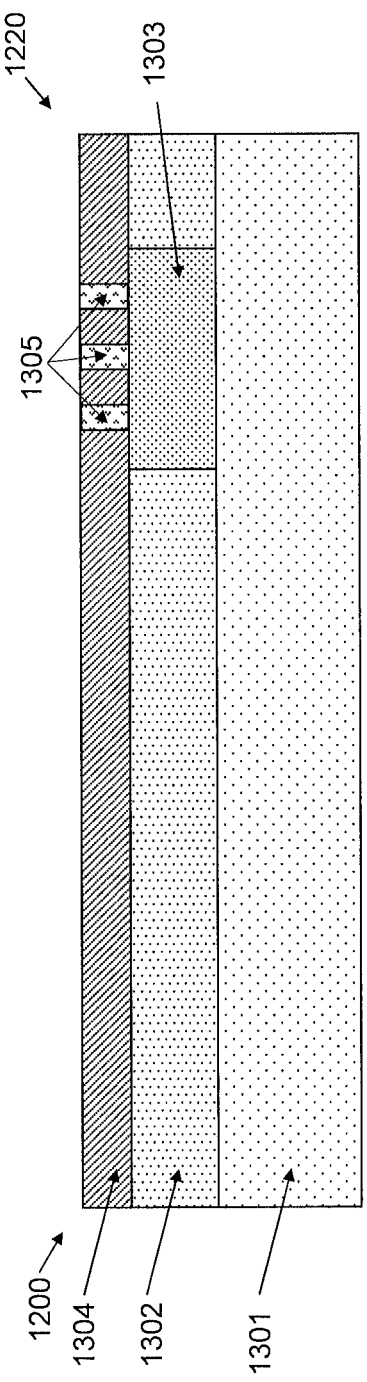
FIG. 14
FIG. 15

RESONANT VIRTUAL SUPPLY BOOSTER FOR SYNCHRONOUS LOGIC CIRCUITS AND OTHER CIRCUITS WITH USE OF ON-CHIP INTEGRATED MAGNETIC INDUCTOR

BACKGROUND

Technical Field

The present invention relates generally to integrated circuits and, in particular, to a resonant virtual supply booster for synchronous logic circuits and other circuits with the use of an on-chip integrated magnetic inductor.

Description of the Related Art

Static and Dynamic logic circuits are used in memories and logic devices to provide high frequency operation with a minimum of die area for performing logical operations and providing storage functionality. Both synchronous static and dynamic logic circuits have controlled evaluation times in that the operation of the circuit before and during a time at which an output value of the logic block evaluates or changes state is determined from the input logic or a storage cell value.

Groups of logic circuits, which are sometimes referred to as "macros", have been power-managed in existing circuits to reduce power consumption, except during certain intervals of time in which power supply current is drawn to provide a read or a write of a storage cell value, or the determination of a logic combination. For example, a dynamic logic circuit may draw no current, or have very low leakage current levels, except when a signal node is precharged with a voltage and then selectively discharged to produce the combinatorial output or storage cell value. A static logic circuit or storage cell only draws significant current when a state change occurs.

Logic circuits have been implemented that include virtual power supply nodes that can be disabled or set to a reduced voltage when the logic circuits are not evaluating, or multiple power supplies can be used to supply higher voltages to critical circuits. In some implementations, circuits have been provided that boost the power supply voltage supplied to the logic circuits during the evaluation phase to reduce the static power supply voltage by including a boost transistor. Such boosting reduces overall power supply voltage requirements. However, the energy expended in changing the voltage of the virtual power supply node voltage offsets any advantage gained, since the virtual power supply nodes typically have large shunt capacitance due to the large numbers of devices that are connected to the virtual power supply nodes.

It would therefore be desirable to provide a virtual power supply circuit for synchronous logic and other logic having a predictable evaluate time that provides for reductions in overall power supply voltage and energy consumption.

SUMMARY

According to an aspect of the present invention, a circuit is provided. The circuit is for providing a supply voltage. The circuit includes a first transistor and a second transistor, coupled to a static power supply that supplies a constant power supply voltage. The circuit further includes a magnetic inductor having a first terminal connected to a common node between the first transistor and the second transistor and a second terminal connected to the dynamic internal power supply node, to supply a dynamic internal power supply node with a boosted voltage relative to the constant power supply voltage by resonating with at least one capacitance coupled to the dynamic internal power supply node.

According to another aspect of the present invention, a method is provided for forming an integrated circuit. The integrated circuit is for providing a supply voltage. The method includes forming a first transistor and a second transistor, coupled in parallel to a static power supply that supplies a constant power supply voltage. The method further includes forming an on-chip magnetic inductor having a first terminal connected to a common node between the first transistor and the second transistor and a second terminal connected to the dynamic internal power supply node, to supply a dynamic internal power supply node with a boosted voltage relative to the constant power supply voltage by resonating with at least one capacitance coupled to the dynamic internal power supply node.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIGS. 12-21 show an exemplary method for making a virtual power supply/boost circuit, in accordance with an embodiment of the present invention.

DETAILED DESCRIPTION

Figure 1:
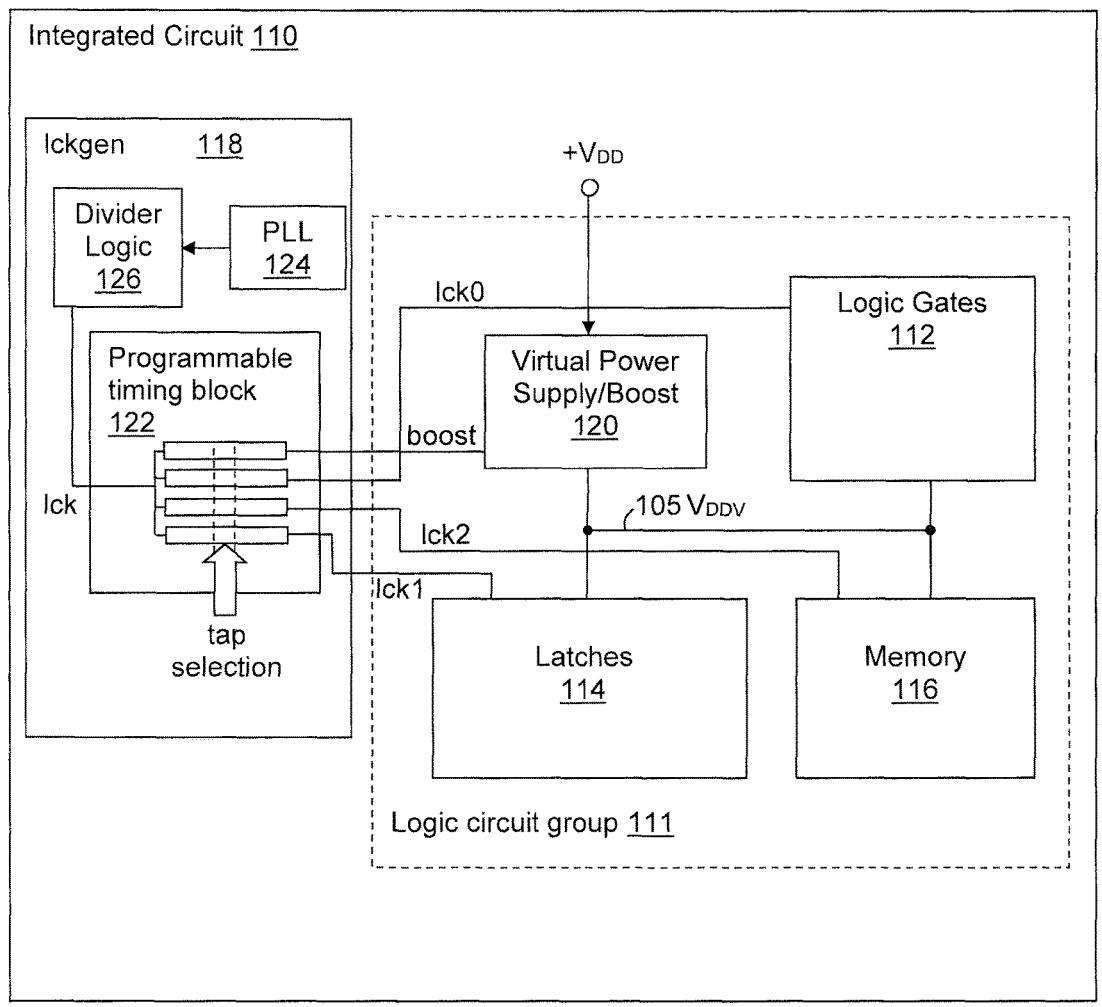
FIG. 1 shows an exemplary integrated circuit (IC), in accordance with an embodiment of the present invention.

The present invention is directed to a resonant virtual supply booster for synchronous logic circuits and other circuits with the use of an on-chip integrated magnetic inductor. The other circuits can be memory circuits or circuits combining logic and memory.

In an embodiment, the resonant virtual supply booster is connected to a dynamic internal power supply node that supplies power to, e.g., the aforementioned synchronous logic circuits and other circuits. In an embodiment, the resonant virtual supply booster is able to provide lower power to the dynamic internal power supply node during a standby mode than during an active mode.

An advantage of using a magnetic inductor in the resonant virtual supply booster is that the magnetic inductor enables much greater inductance compared to a conventional inductor. Moreover, a significantly higher Q can be achieved at a desired frequency by the magnetic inductor. For example, directly placing ferromagnetic or a magnetic inductor above a macro can reduce Q and L loss as well as overall area.

The present invention relates to devices including logic circuits such as memory devices, processors and other circuits in which low-voltage and low power operation are desirable. Instead of a typical static power supply, virtual power supply rails are used to reduce the power supply rail voltage, and thus the power consumption due to leakage when the circuits in a given "macro" or circuit block are not active. In the exemplary device disclosed herein, the static power supply voltage can be further reduced, as one or more techniques for dynamically boosting the virtual power supply rail voltage are included, which extend to the use of a magnetic inductor to form a resonant circuit and/or sequencing multiple resonant or non-resonant boost circuits to increase the amount of available voltage boost. In the resonant boost configurations, the energy used to boost the virtual power supply rail voltage is stored and recycled when the voltage decreases after the boost interval, which has a timing related to a clock that controls evaluation in the logic circuit. The clock may be a clock that controls pre-charge and evaluation cycles in a dynamic logic circuit or a clock that time state changes in a static logic circuit, which is also considered an evaluation as the term is used herein.

Hence, the present invention is embodied in a virtual power supply rail booster circuit and method of operation that provides reduced power consumption and supply voltage requirements.

In an embodiment, the booster circuit includes a first transistor that couples a dynamic internal power supply node of a group of logic circuits to a static power supply that supplies a substantially constant power supply voltage to the group of logic circuits. The first transistor is disabled in response to a first phase of a boost clock that is synchronized with a functional clock of the group of logic circuits that controls evaluation for dynamic logic circuits and state changes for static logic circuits. The booster circuit also includes an inductor coupled to the dynamic internal power supply node for resonating with at least one capacitance coupled to the dynamic internal power supply node, so that when the first transistor is disabled according to a second phase of the boost corresponding to an evaluation time of the group of logic circuits, a voltage of the dynamic internal power supply node increases in magnitude to a value substantially greater than a magnitude of the power supply voltage by the inductor resonating with the capacitance coupled to the dynamic internal power supply node. The energy used to raise the voltage of the dynamic internal power supply node is stored by the inductor and recycled. A second boost transistor, which may be a FINFET device, may be controlled by another phase of the clock to couple a rising edge of the clock to start the resonant boost. The other phase of the clock may be a delayed version of the boost clock signal. While various embodiments of the present invention describe the use of a FINFET device as the "second boost transistor", it is to be appreciated that other types of transistors can also be used, while maintaining the spirit of the present invention. For example, a multi-gate transistor, a Gate-All-Around (GAA) transistor, and so forth can also be used in accordance with the teachings of the present invention, while maintaining the spirit of the present invention. In fact, carbon nanotubes and other technologies can also be used, while maintaining the spirit of the present invention. These and other variations of the present invention are readily determined by one of ordinary skill in the art, given the teachings of the present invention provided herein.

In another embodiment, the booster circuit may include multiple boost transistors that are controlled by different phases of the clock so that the resonant boost circuit is successively stimulated to increase the amount of voltage rise at the dynamic internal power supply node, and in some embodiments, multiple inductors may be coupled through multiple boost devices to the dynamic internal power supply node and stimulated in succession to increase the amount of voltage rise.

With reference now to the figures, and in particular with reference to FIG. 1, an exemplary integrated circuit (IC) 110 is shown, which may represent a processor integrated circuit, a memory device, or another very-large scale integrated circuit (VLSI) that includes logic and storage, in accordance with an embodiment of the present invention. Within IC 110, a logic circuit group 111 (or "macro") includes exemplary logic gates 112, latches 114 and memory 116, all of which are provided operating power from a dynamic internal power supply node 105 that has a voltage $V_{DDV}$ that may be varied dynamically to reduce power consumption when logic circuit group 111 is not operating or, in the case of the present example, when the circuits in logic circuit group 111 are not being readied to generate a state change. The state changes in logic circuit group 111 are synchronized by one or more clock signals provided from a clock generator 118. Exemplary clock generator 118 includes a phase-lock loop (PLL) 124 that generates a high-frequency clock, and a divider logic 126 that generates various clock phases and control signals from the high-frequency clock, including a clock signal lck that is provided to an input of a programmable timing block 122 that generates clock signals lck0, lck1, lck2 provided to logic circuit group 111, and a boost clock boost that is provided to a virtual power supply/boost circuit 120 within logic circuit group 111.

Techniques included in virtual power supply/boost circuit 120 generate peak boosted values of voltage $V_{DDV}$ on dynamic internal power supply node 105 that are substantially greater than a static power supply voltage $V_{DD}$ supplied to the input of virtual power supply/boost circuit 120 and that operates other circuits within integrated circuit 110, so that the value of static power supply voltage $V_{DD}$ can be reduced, while still meeting performance requirements within dynamic circuit group 111. Particular techniques to provide the boosted voltage $V_{DDV}$ are described below with reference to FIGS. 2-8. In general, virtual power supply/boost circuit 120 generates voltage $V_{DDV}$ to align a boosted portion value of output voltage $V_{DDV}$ with particular times for which the value of the voltage supplied to exemplary logic gates 112, latches 114 and memory 116 is the most critical for performance, which allows the static value of a static power supply voltage $V_{DD}$ that supplies virtual power supply/boost circuit 120 to be reduced. Generally, the boosted portion of output voltage $V_{DDV}$ is placed at the set-up interval before a static or dynamic evaluation is commenced by clock signals lck0, lck1, lck2. Programmable timing block 122 includes tapped delay lines 128 formed by buffers/inverters and selectors so that the timing of lck0, lck1, lck2 and boost clock boost are optimized for instant frequency, voltage and other environmental and circuit conditions. However, integrated circuit 110 as illustrated in FIG. 1 is only an example and fixed clock buffer chains can be employed as an alternative. In an embodiment, signals (boost) coming to boost block 120 can be buffered differently to boost latches, memory and logic per their timing rules. Thus, the boost level is delivered in accordance with appropriate timing rules.

Figure 2:
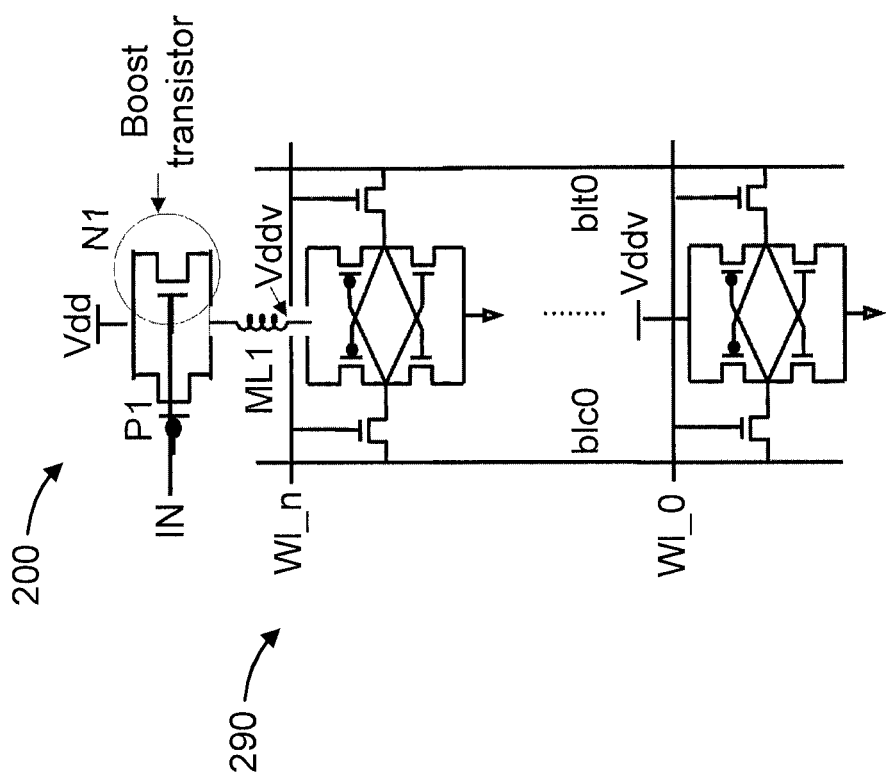
FIG. 2 shows a first example of a virtual power supply/boost circuit, in accordance with an embodiment of the present invention.

Referring now to FIG. 2, a first example of a virtual power supply/boost circuit 200 that may be used to implement virtual power supply/boost circuit 120 of integrated circuit 110 of FIG. 1 is shown, in accordance with an embodiment of the present invention. In the example of FIG. 2, virtual power supply/boost circuit 200 is shown with an array of memory cells 290 powered by a voltage Vddv, and controlled by word lines (W1_0 to W1_n) and bit lines (blc0 to blt0). Virtual power supply/boost circuit 200 includes a first transistor P1 and a second boost transistor N1. The boost transistor N1 is implemented by an n-type FinFET with its gate controlled by "IN" signal (also interchangeably referred to as "boost" signal herein), which has a large gate to body capacitive coupling and is advantageous for such applications. In standby, "IN" is "Low", thus the virtual array supply voltage "Vddv" is at "Vdd". With both its drain and source at "Vdd", the fully-depleted body of the booster nFET N1 is at "Vdd" as well. The virtual power supply/boost circuit 200 also includes an inductor L1 between these transistors (P1 and N1) and a memory cell (not shown). The inductor ML1 is made of and/other otherwise includes magnetic material (and is interchangeably referred to herein as "magnetic inductor" ML1).

During a Read operation, the "IN" signal ramps to "High", thus turning off the transistor P1. The ramping up of the gate signal "IN" is capacitively coupled to the floating-body of the booster transistor N1, thus bringing the body potential to a level significantly above VDD.

As such, the source node of the booster transistor N1 (which is the virtual array supply node) is capacitively coupled up by the body-to-source capacitance.

The magnetic inductor ML resonates the boosted supply and helps write-ability by collapsing the cell supply initially and then raising the supply voltage.

Figure 3:
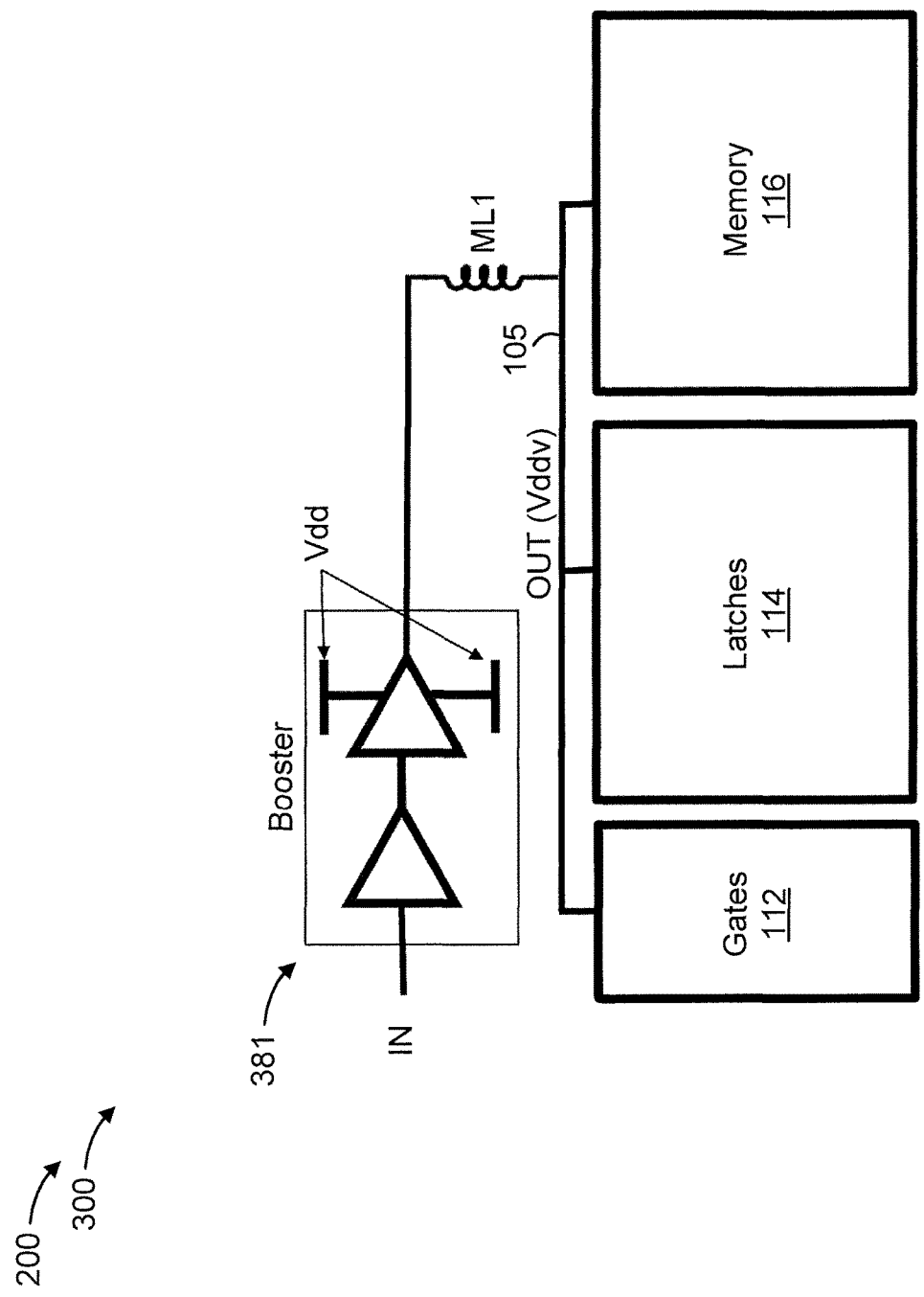
FIG. 3 shows the first example of the virtual power supply/boost circuit shown in FIG. 2 depicted using a different representation, in accordance with an embodiment of the present invention.

Referring to FIG. 3, the first example of the virtual power supply/boost circuit 200 shown in FIG. 2 is depicted using a different representation 300, in accordance with an embodiment of the present invention. The different representation 300 shows N1 and P1 of FIG. 2 as a pair 381 of inverters (also interchangeably referred to as "booster") and also includes magnetic inductor ML1. In particular, the booster and the magnetic inductor ML1 are shown relative to the gates 112, the latches 114, and the memory 116 depicted in FIG. 1. The magnetic inductor ML1, which is a resonant ferromagnetic booster inductor, is connected between an output of N1 and an output "OUT" (Vddv) of the virtual power supply/boost circuit 200. The magnetic inductor ML1 helps to boost and resonate the boosted supply so that a dual supply can be eliminated.

Figure 4:
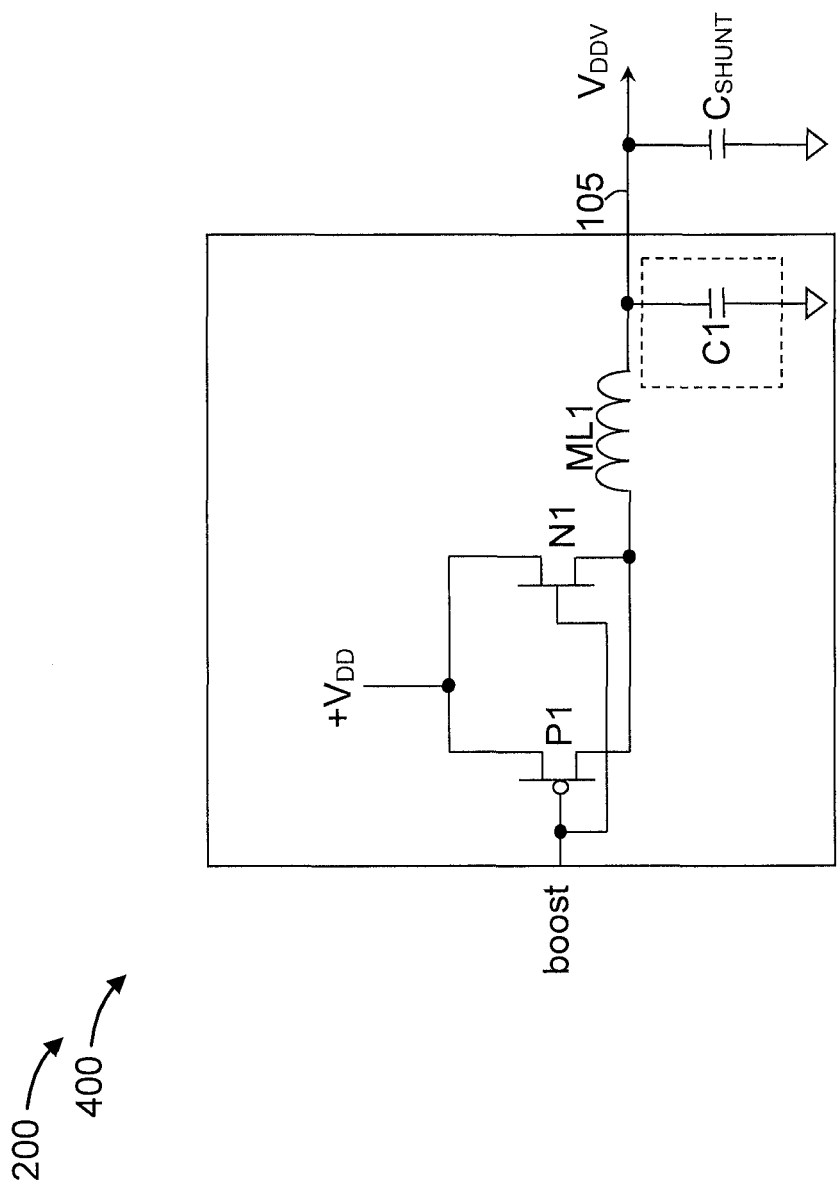
FIG. 4 shows the first example of the virtual power supply/boost circuit shown in FIG. 2 depicted using another different representation, in accordance with an embodiment of the present invention.

Referring to FIG. 4, the first example of the virtual power supply/boost circuit 200 shown in FIG. 2 is depicted using a different representation 400, in accordance with an embodiment of the present invention. The different representation 400 shows shunt capacitance $C_{SHUNT}$ of all of the devices (e.g., gates, latches, memory) connected to dynamic internal power supply node 105 and any additional capacitance C1 that may optionally be included in virtual power supply/boost circuit. Hence, the following description is made with reference to $C_{SHUNT}$ and C1.

First transistor P1 clamps output virtual power supply voltage $V_{DDV}$ at the value of static power supply voltage $V_{DD}$ when boost clock boost is de-asserted, i.e., in the low voltage state in the example. Second boost transistor N1 has a body initially at the value of static power supply voltage $V_{DD}$ as input clock signal boost is de-asserted. The rising edge of boost clock boost is capacitively coupled through the gate of boost transistor N1 to a terminal of magnetic inductor ML1 that couples first transistor P1 and boost transistor N1 to dynamic internal power supply node 105 as boost transistor N1 turns on. Since the current through magnetic inductor ML1 is zero before the rising edge of boost clock boost and since the body of boost transistor N1 is at the value of static power supply voltage $V_{DD}$, when the edge of boost clock boost is coupled through magnetic inductor ML1 to the dynamic internal power supply node 105, a rapid increase in current through magnetic inductor ML1 causes dynamic internal power supply node voltage $V_{DDV}$ to rise with a wave shape controlled by the series resonant frequency of magnetic inductor ML1 combined with capacitance $C_{SHUNT}$ and capacitance C1. However, since boost transistor N1 is also turning on, and since shunt capacitance $C_{SHUNT}$ is also in parallel with leakage and active currents of the devices connected to the dynamic internal power supply node 105, the resonant behavior of magnetic inductor ML1 with the total capacitance is damped and the conduction of boost transistor N1 works to prevent dynamic internal power supply node voltage $V_{DDV}$ from falling much below static power supply voltage $V_{DD}$. In general, internal power supply node voltage $V_{DDV}$ should not fall below $V_{DD}$-$V_T$, where $V_T$ is the threshold voltage of boost transistor N1.

Figure 5:
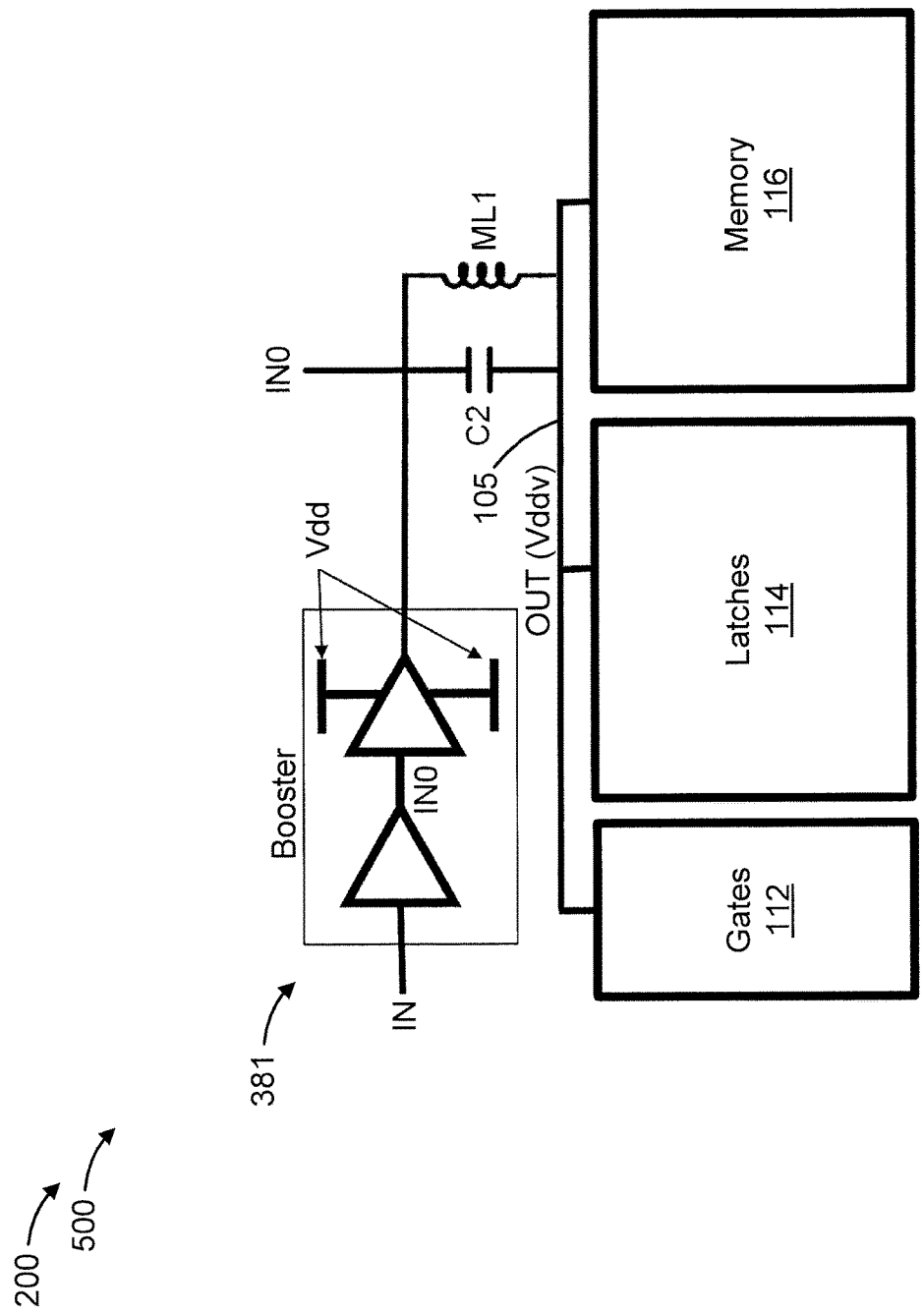
FIG. 5 shows a second example of a virtual power supply/boost circuit, in accordance with an embodiment of the present invention.

Referring now to FIG. 5, a second example of a virtual power supply/boost circuit 500 that may be alternatively used to implement virtual power supply/boost circuit 120 of integrated circuit 110 of FIG. 1 is shown, in accordance with an embodiment of the present invention. This example is depicted using a similar representation as FIG. 3 (i.e., relative to the gates 112, the latches 114, and the memory 116 depicted in FIG. 1). Virtual power supply/boost circuit 500 is similar to virtual power supply/boost circuit 300 of FIG. 3, so only differences between virtual power supply/boost circuit 500 and virtual power supply/boost circuit 300 will be described below. In virtual power supply/boost circuit 500, an interconnect capacitor C2 is added across (in parallel to) magnetic inductor ML1. When IN0 is varied dynamically and when it goes high, then VDDV will couple to a value higher than the supply voltage, pushing or boosting the voltage even further. Thus, interconnect capacitor C2 acts as a boost capacitor.

Figure 6:
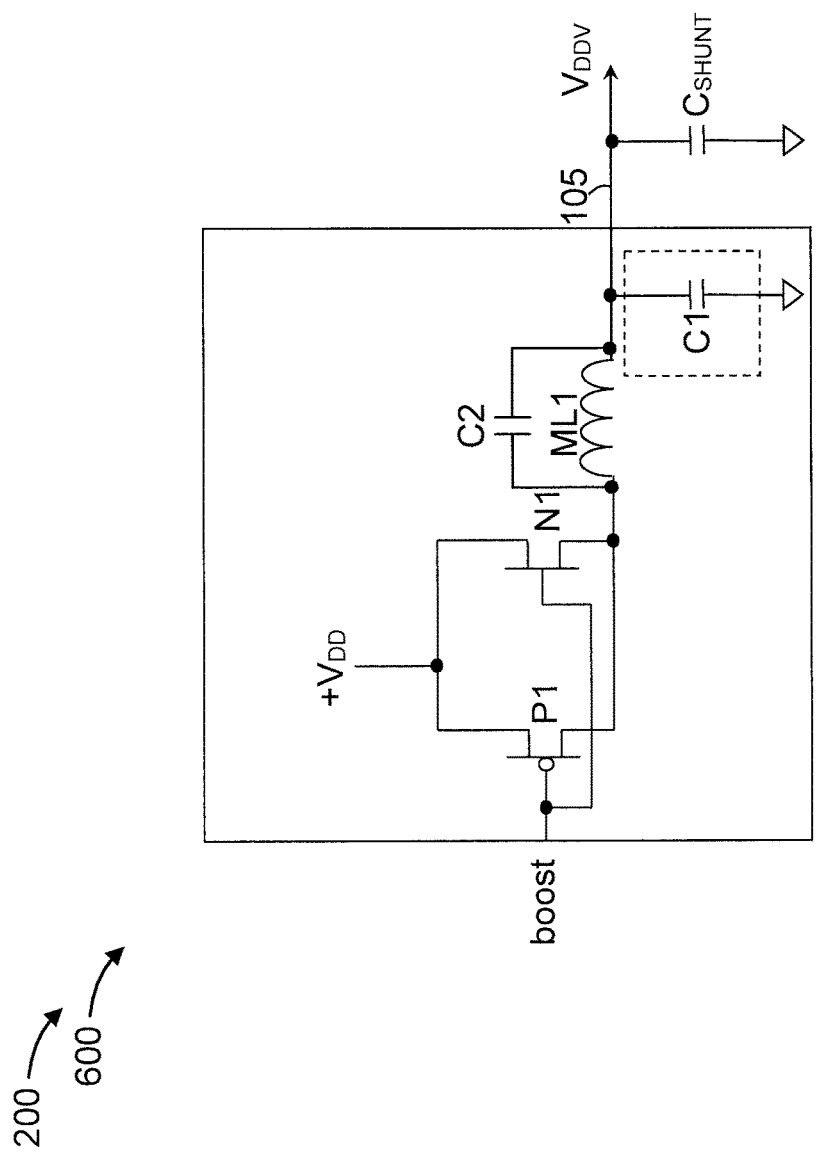
FIG. 6 shows the second example of the virtual power supply/boost circuit shown in FIG. 5 depicted using a different representation, in accordance with an embodiment of the present invention.

Referring to FIG. 6, the second example of the virtual power supply/boost circuit 500 shown in FIG. 5 is depicted using a different representation 600, in accordance with an embodiment of the present invention. The different representation 600 shows shunt capacitance $C_{SHUNT}$ of all of the devices (e.g., gates, latches, memory) connected to dynamic internal power supply node 105 and any additional capacitance C1 that may optionally be included in virtual power supply/boost circuit. Similar to FIG. 5, interconnect capacitor C2 is added across (in parallel to) magnetic inductor ML1.

Figure 7:
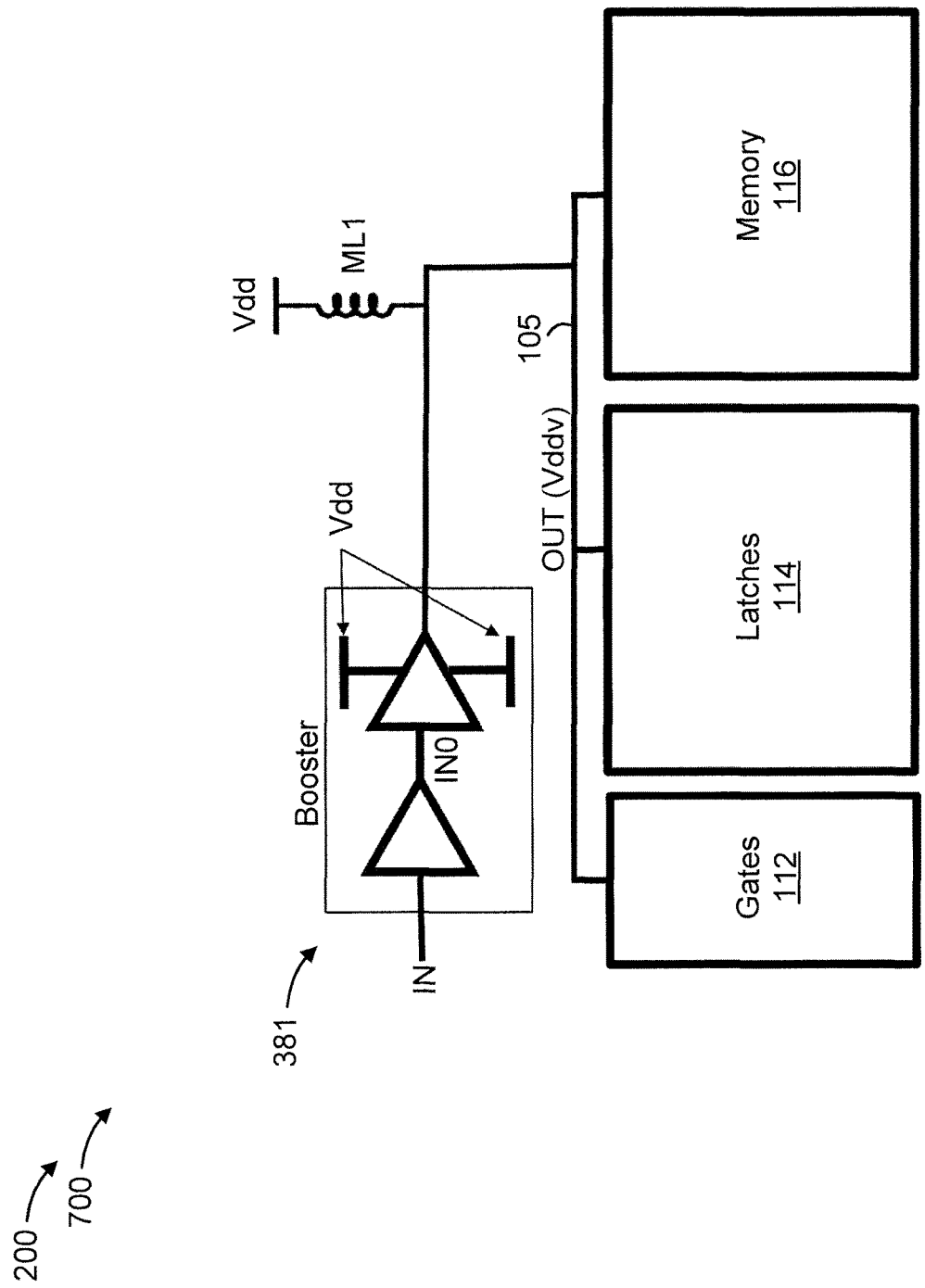
FIG. 7 shows a third example of a virtual power supply/boost circuit, in accordance with an embodiment of the present invention.

Referring now to FIG. 7, a third example of a virtual power supply/boost circuit 700 that may be alternatively used to implement virtual power supply/boost circuit 120 of integrated circuit 110 of FIG. 1 is shown, in accordance with an embodiment of the present invention. Virtual power supply/boost circuit 700 is similar to virtual power supply/boost circuit 300 of FIG. 3, so only differences between virtual power supply/boost circuit 500 and virtual power supply/boost circuit 300 will be described below. In virtual power supply/boost circuit 700, the magnetic inductor ML1 is connected between a power supply voltage Vdd and an output of the booster 389 (that is, the output "OUT" (Vddv) of the virtual power supply/boost circuit 700). Thus, one terminal of magnetic inductor ML1 and the source and drain of FinFET N1 are commonly connected to voltage Vdd, with the other terminal of the magnetic inductor ML1 is connected to voltage Vddv (the dynamic internal power supply node 105).

Figure 8:
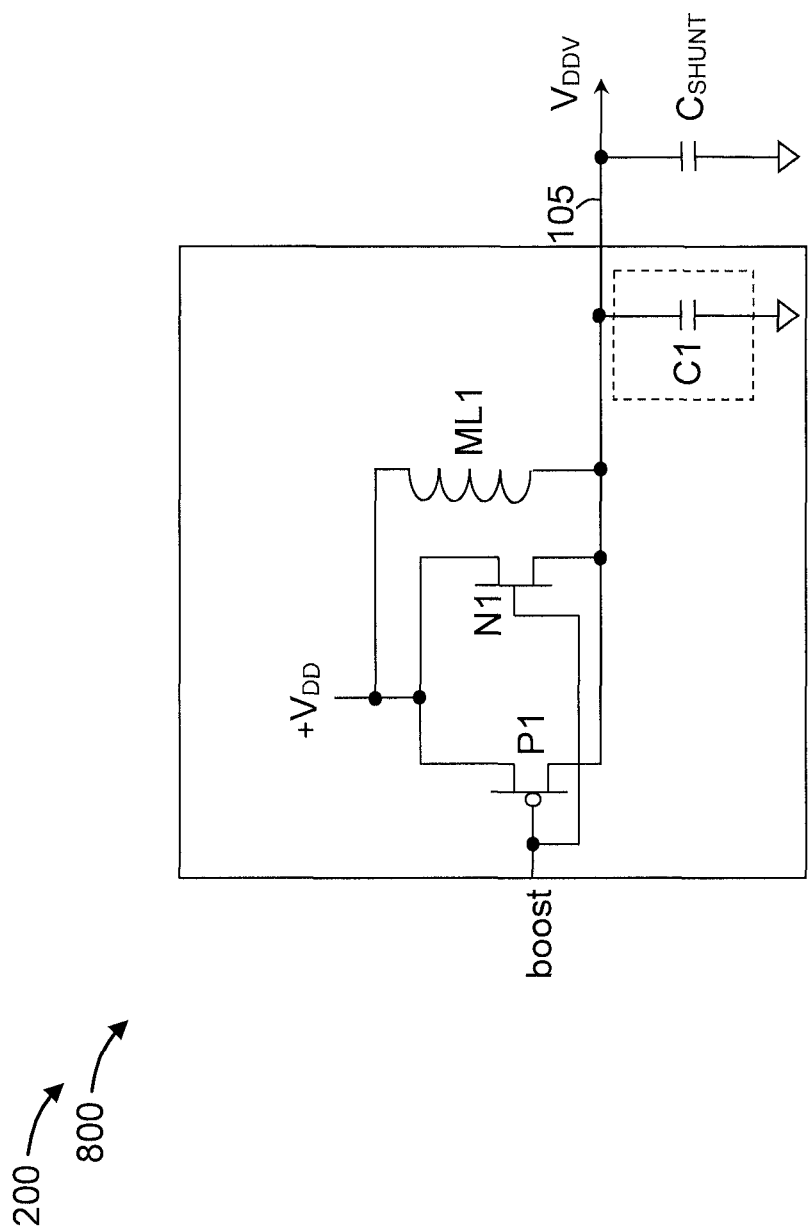
FIG. 8 shows the third example of the virtual power supply/boost circuit shown in FIG. 7 depicted using a different representation, in accordance with an embodiment of the present invention.

Referring to FIG. 8, the third example of the virtual power supply/boost circuit 700 shown in FIG. 7 is depicted using a different representation 800, in accordance with an embodiment of the present invention. The different representation 800 shows shunt capacitance $C_{SHUNT}$ of all of the devices (e.g., gates, latches, memory) connected to dynamic internal power supply node 105 and any additional capacitance C1 that may optionally be included in virtual power supply/boost circuit. Similar to FIG. 6, the magnetic inductor ML1 is connected between a power supply voltage Vdd and an output of the booster 389 (that is, the output "OUT" (Vddv) of the virtual power supply/boost circuit 700).

Figure 9:
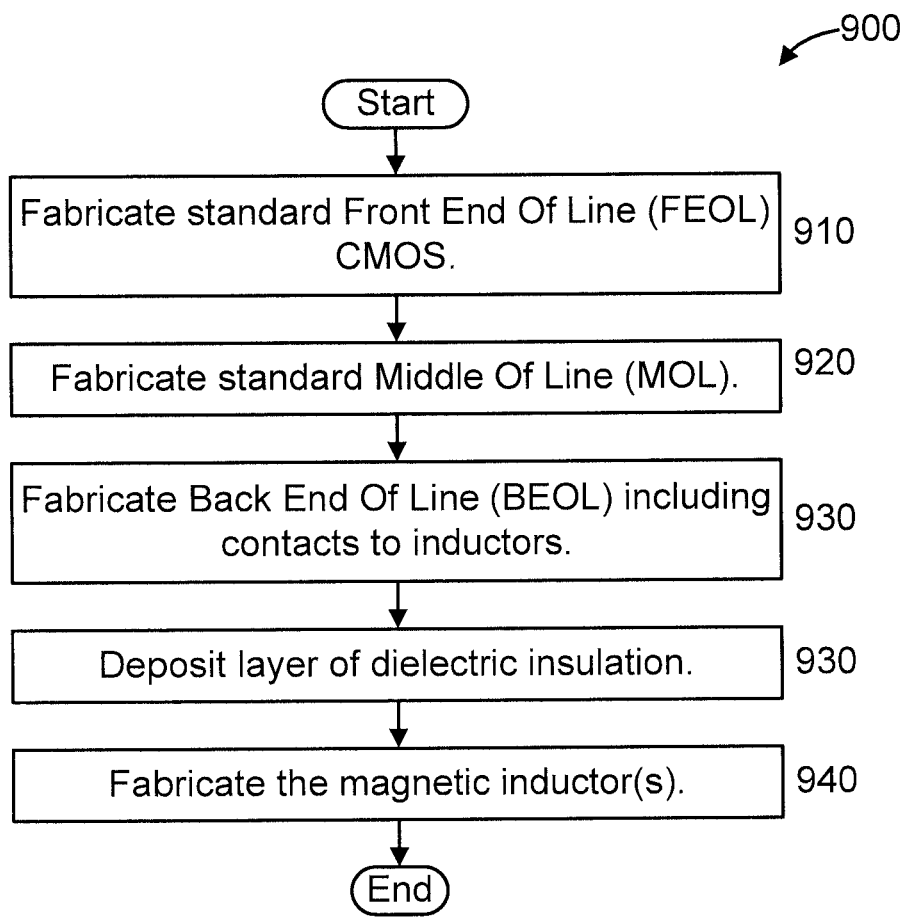
FIG. 9 shows a block diagram of an exemplary design flow for forming a resonant virtual supply booster for synchronous logic circuits and other circuits using an on-chip integrated magnetic inductor, in accordance with an embodiment of the present invention.

Referring to FIG. 9, a block diagram of an exemplary method 900 for forming a resonant virtual supply booster for synchronous logic circuits and other circuits using an on-chip integrated magnetic inductor, in accordance with an embodiment of the present invention.

At step 910, fabricate stand Front End Of Line (FEOL) CMOS.

At step 920, fabricate standard Middle Of Line (MOL).

At step 930, fabricate Back End Of Line (BEOL) including contacts to inductors.

At step 940, deposit a layer of dielectric insulation.

At step 950, fabricate the magnetic inductor(s).

Figure 10:
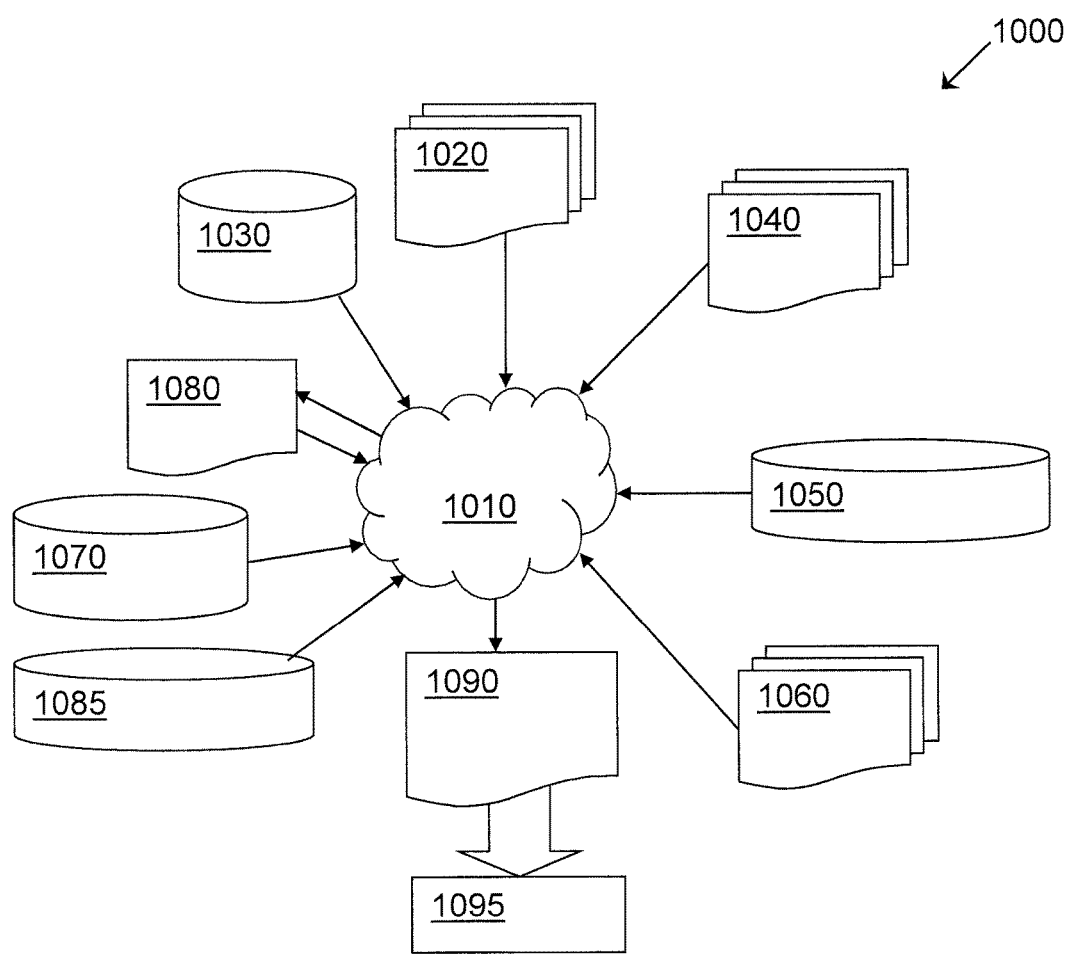
FIG. 10 shows a block diagram of an exemplary design flow used for example, in semiconductor IC logic design, simulation, test, layout, and manufacture, in accordance with an embodiment of the present invention.

Referring to FIG. 10, an exemplary design flow 1000 used for example, in semiconductor IC logic design, simulation, test, layout, and manufacture, is shown, in accordance with an embodiment of the present invention. Design flow 1000 includes processes, machines and/or mechanisms for processing design structures or devices to generate logically or otherwise functionally equivalent representations of the design structures and/or devices described above and shown in FIGS. 1-8. The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera Inc. or Xilinx, Inc.

FIG. 10 illustrates multiple such design structures including an input design structure 1020 that is preferably processed by a design process 1010. Input design structure 1020 may be a logical simulation design structure generated and processed by design process 1010 to produce a logically equivalent functional representation of a hardware device. Input design structure 1020 may also or alternatively comprise data and/or program instructions that when processed by design process 1010, generate a functional representation of the physical structure of a hardware device. Whether representing functional and/or structural design features, input design structure 1020 may be generated using electronic computer-aided design (ECAD) such as implemented by a core developer/designer. When encoded on a machine-readable data transmission, gate array, or storage medium, input design structure 1020 may be accessed and processed by one or more hardware and/or software modules within design process 1010 to simulate or otherwise functionally represent an electronic component, circuit, electronic or logic module, apparatus, device, or system such as those shown in FIGS. 1-8. As such, input design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules for synthesizing, translating, or otherwise processing a design/simulation functional equivalent of the components, circuits, devices, or logic structures shown in FIGS. 1-8 to generate a Netlist 1080 which may contain design structures such as input design structure 1020. Netlist 1080 may comprise, for example, compiled or otherwise processed data structures representing a list of wires, discrete components, logic gates, control circuits, 1010 devices, models, etc. that describes the connections to other elements and circuits in an integrated circuit design. Netlist 1080 may be synthesized using an iterative process in which netlist 1080 is resynthesized one or more times depending on design specifications and parameters for the device. As with other design structure types described herein, netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including Netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process input design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to input design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 1090 may comprise a compiled, executable HDL simulation model that functionally simulates the devices shown in FIGS. 1-8.

Design structure 1090 may also employ a data format used for the exchange of layout data of integrated circuits and/or symbolic data format (e.g. information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8 and 12-21. Design structure 1090 may then proceed to a stage 1095 where, for example, design structure 1090: proceeds to tape-out, is released to manufacturing, is released to a mask house, is sent to another design house, is sent back to the customer, etc.

Figure 11:
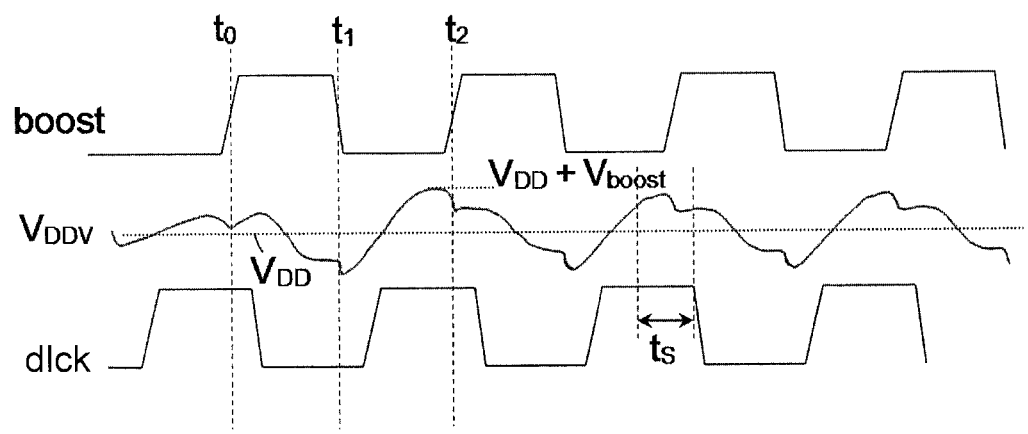
FIG. 11 shows a waveform diagram illustrating signals within the virtual power supply/boost circuit of FIG. 3, in accordance with an embodiment of the present invention.

Referring to FIG. 11, waveforms within the virtual power supply/boost circuit 300 of FIG. 3 are shown, in accordance with an embodiment of the present invention. At time $t_0$, boost clock boost rises, turning transistor P1 off, which causes the voltage across inductor L1 to rise. Boost clock boost also couples through the gate of boost transistor N1 to the source of boost transistor N1, further contributing to the voltage rise of dynamic internal power supply node voltage $V_{DDV}$. When boost clock boost is asserted on a next cycle at time $t_1$, because inductor L1 has decoupled dynamic internal power supply node voltage $V_{DDV}$ from the source of transistor P1, the source terminal of transistor P1 and the source of boost transistor N1 will be clamped to static power supply voltage $V_{DD}$, while dynamic internal power supply node voltage $V_{DDV}$ continues to follow a sinusoidal shape that peaks just prior to the next de-assertion of boost clock signal boost. As shown in FIG. 11 when boost clock boost is de-asserted at time $t_2$, dynamic internal power supply node voltage $V_{DDV}$ is substantially greater than static power supply voltage $V_{DD}$ and has been for an interval sufficient to ensure set-up times for the dynamic circuits that evaluate when boost clock boost is de-asserted. As an example, a digital circuit clock dlck is shown, which controls an evaluation of a circuit block via a falling edge. An example set-up interval $t_{SU}$ is shown to illustrate how the timing of boost clock boost is controlled with respect to another clock that controls logic circuit state evaluation (including memory stores or reads) so that dynamic internal power supply node voltage $V_{DDV}$ has a boosted value during a critical timing period during which the boosted voltage improves performance over performance that would be achieved at the lower value of static power supply voltage $V_{DD}$, i.e., without boost circuit 300. Not only does virtual power supply/boost circuit 300 provide a timed increase in dynamic internal power supply node voltage $V_{DDV}$, but the energy required to produce the increase, which is substantial due to the large shunt capacitance $C_{SHUNT}$ of all of the devices connected to dynamic internal power supply node 105, is stored in inductor L1 during the time before the assertion of boost clock boost and used to aid in producing the next peak of dynamic internal power supply node voltage $V_{DDV}$ prior to the next de-assertion of boost clock boost, i.e. the next evaluation.

FIGS. 12-21 show an exemplary method 1200 for making a virtual power supply/boost circuit, in accordance with an embodiment of the present invention. Regarding method 1200, certain materials have been specified for the sake of illustration. However, it is to be appreciated that the present invention is not limited to solely the mentioned materials and, thus, other materials can also be used, as readily appreciated by one of ordinary skill in the art given the teachings of the present invention provided herein, while maintaining the spirit of the present invention.

Referring to FIG. 12, at step 1205, provide a wafer substrate 1301.

Referring to FIG. 13, at step 1210, form Front End Of Line (FEOL)/Back End Of Line (BEOL) layers 1302 for circuits and form a resonant clock circuit 1303 within the FEOL/BEOL layers 1302.

Referring to FIG. 14, at step 1215, process the sequence to add a magnetic inductor. In an embodiment, step 1215 can involve, for example, adding a layer of low k or a $SiO_2$ dielectric 1304.

Referring to FIG. 15, at step 1220, continue processing the sequence to add a magnetic inductor. In an embodiment, step 1220 can involve, for example, forming a bottom wire level 1305 by conventional lithography and etching following by metal filling and chemical mechanical polishing.

Figure 16:
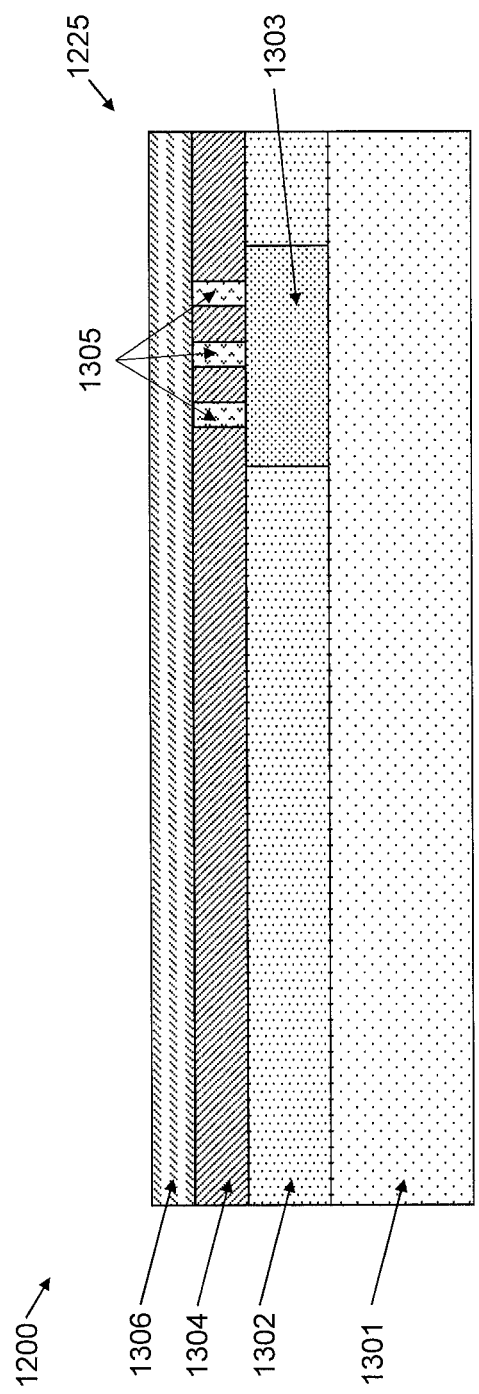

Referring to FIG. 16, at step 1225, continue processing the sequence to add a magnetic inductor. In an embodiment, step 1225 can involve, for example, depositing a laminated magnetic material 1306. In an embodiment, the laminated magnetic material 1306 is composed of Cobalt (Co) that includes magnetic material FeTaN and/or FeNi and/or FeAlO and/or any combination thereof and is laminated with a dielectric material including, but not limited to silicone dioxide and/or silicon nitride.

Figure 17:
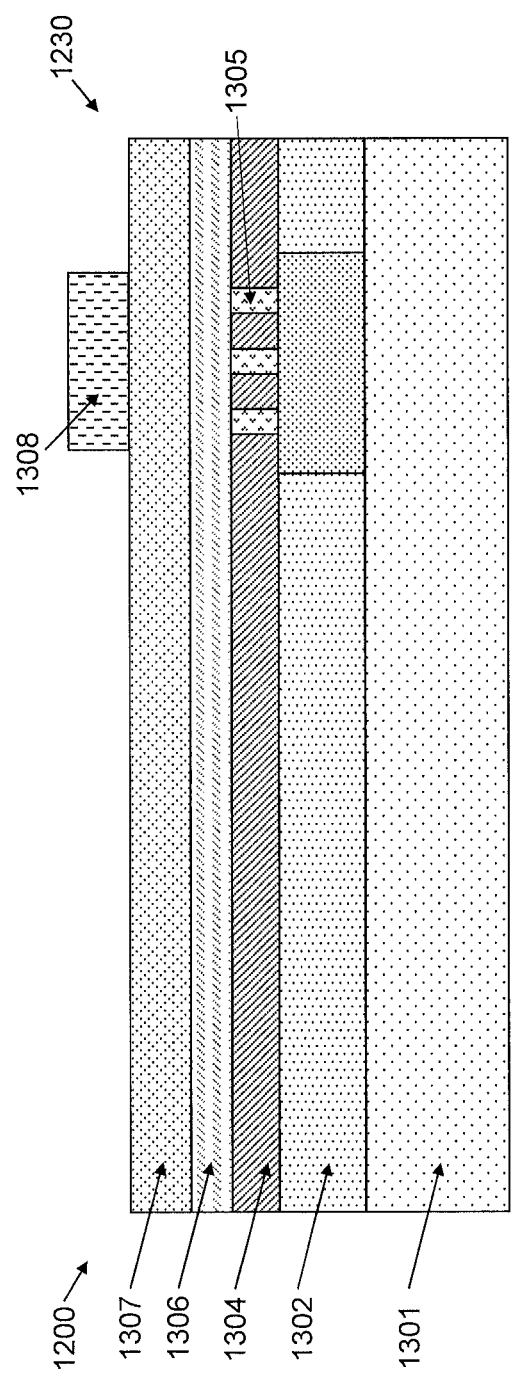

Referring to FIG. 17, at step 1230, continue processing the sequence to add a magnetic inductor. In an embodiment, step 1230 can involve, for example, patterning the magnetic material. In an embodiment, the patterning of the magnetic material can involve, for example, using an oxide hard mask 1307 and a photolithography process to form resist images 1308.

Figure 18:
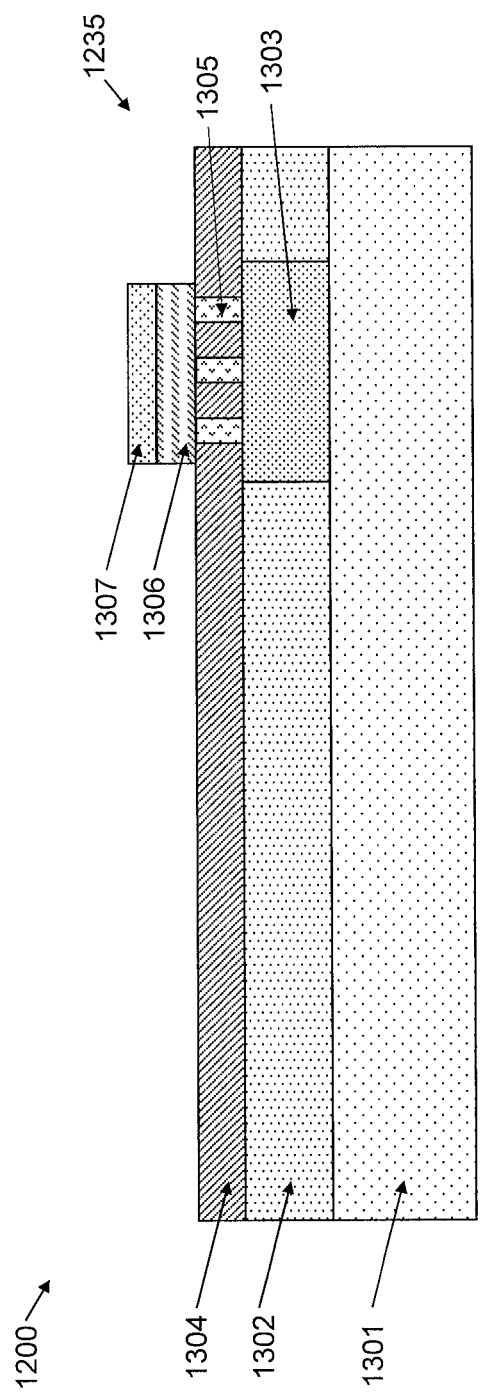

Referring to FIG. 18, at step 1235, continue processing the sequence to add a magnetic inductor. In an embodiment, step 1235 can involve, for example, further patterning the magnetic material. In an embodiment, the patterning of the magnetic material can involve, for example, further using an oxide hard mask 1307 and a photolithography process.

Figure 19:
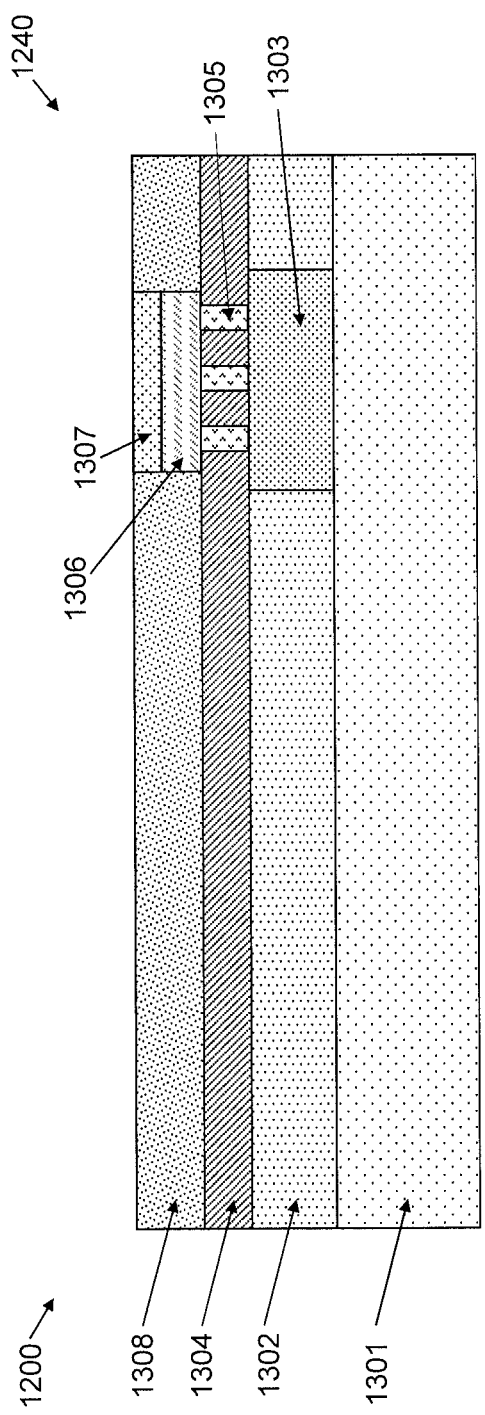

Referring to FIG. 19, at step 1240, continue processing the sequence to add a magnetic inductor. In an embodiment, step 1240 can involve, for example, depositing a dielectric 1308 and planarizing.

Figure 20:
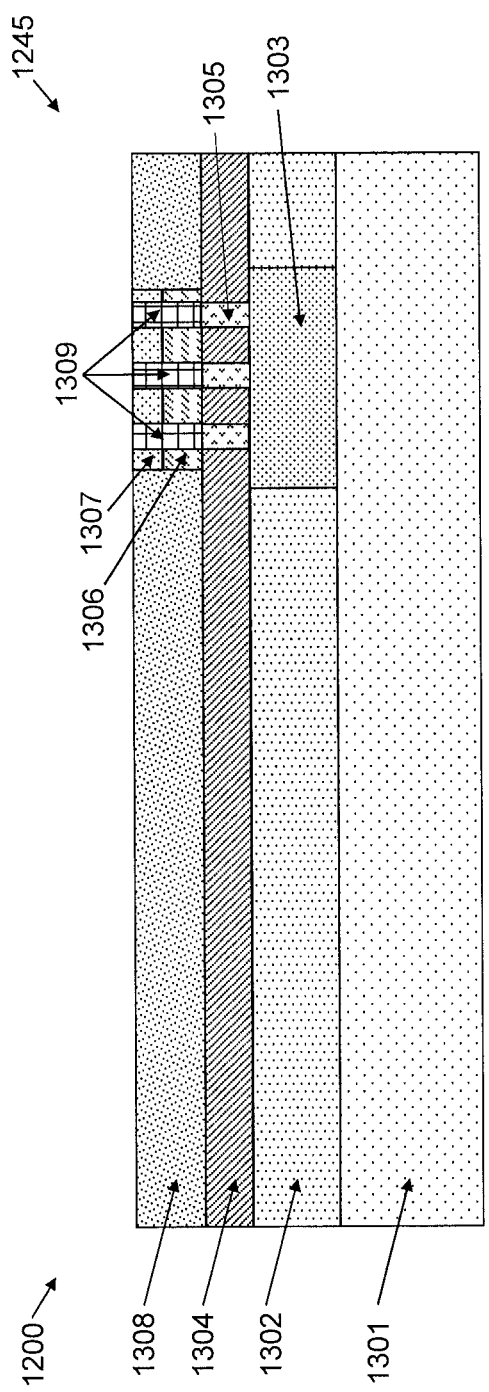

Referring to FIG. 20, at step 1245, continue processing the sequence to add a magnetic inductor. In an embodiment, step 1245 can involve, for example, forming a contact level that includes contacts 1309.

Figure 21:
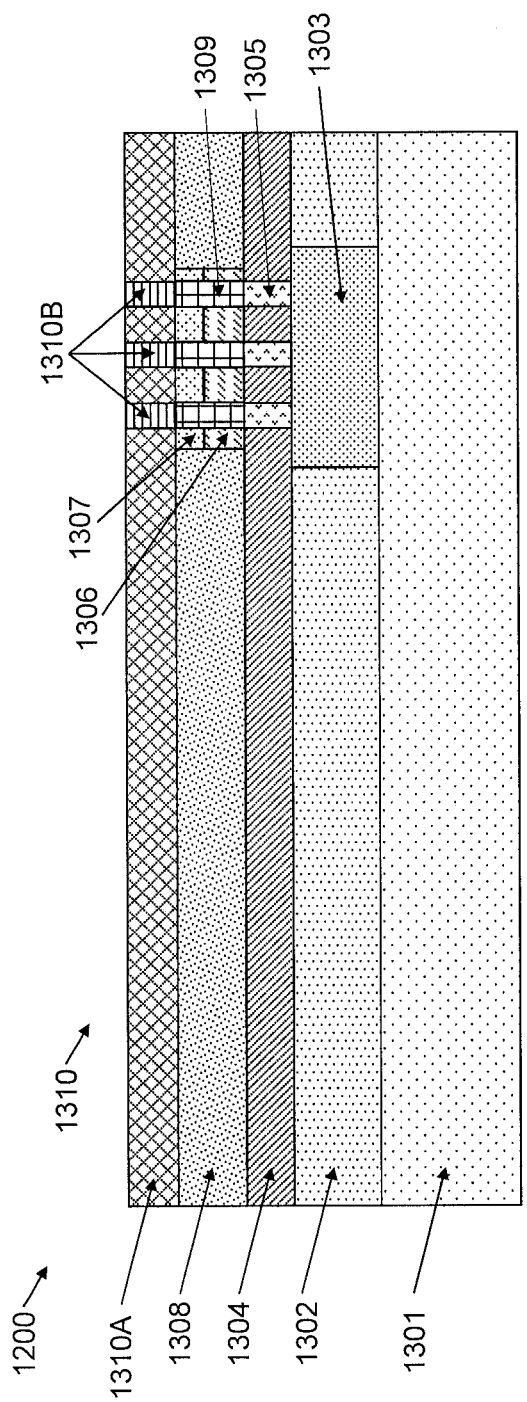

Referring to FIG. 21, at step 1250, continue processing the sequence to add a magnetic inductor. In an embodiment, step 1250 can involve, for example, forming a top wire level 1310. In an embodiment, the top wire level 1310 is formed by depositing a top dielectric 1310A, and performing conventional lithography and etching. The resultant dielectric trenches filled with liner, seed, and plate metal (collectively denoted by the figure reference numeral 1310B), and then the metal is planarized to the top surface of the dielectric 1310A.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C).

This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A circuit for providing a supply voltage, comprising:
a first transistor and a second transistor, of different channel types from among N and P channel types, coupled to a static power supply that supplies a constant power supply voltage, the second transistor having two gate terminals connected to a gate terminal of the first transistor; and
a magnetic inductor having a first terminal connected to a common node between the first transistor and the second transistor and a second terminal connected to a dynamic internal power supply node, to supply a dynamic internal power supply node with a boosted voltage relative to the constant power supply voltage by resonating with at least one capacitance coupled to the dynamic internal power supply node.

2. The circuit of claim 1, further comprising a capacitor, different from the at least one capacitance, connected in parallel to the magnetic inductor such that a first terminal of the capacitor is connected to the common node between the first transistor and the second transistor and a second terminal of the capacitor is connected to the dynamic internal power supply node.

3. The circuit of claim 1, wherein the first transistor is disabled in response to a first phase of a boost clock that is synchronized with a functional clock of the group of other circuits that controls an evaluation for dynamic logic circuits and state changes for static logic circuits in the group of other circuits.

4. The circuit of claim 3, wherein the magnetic inductor resonates with the at least one capacitance to supply the dynamic internal power supply node with the boosted voltage, responsive to the first transistor being disabled during a second phase of the boost clock.

5. The circuit of claim 4, wherein the second phase of the boost clock is provided at a timing corresponding to the evaluation time for the dynamic logic circuits and the state changes for the static logic circuits to provide the boost voltage during the evaluation time and the state changes.

6. The circuit of claim 1, wherein the second transistor has the two gates terminal coupled to a boost clock, a source terminal connected to the dynamic internal power supply node, and a drain terminal connected to the static power supply.

7. The circuit of claim 6, wherein the first transistor has a source terminal connected to the source terminal of the second transistor, and a drain terminal connected the drain terminal of the second transistor.

8. The circuit of claim 1, whereby the second transistor is enabled by a first phase of a boost clock and has a source terminal connected to a source terminal of the first transistor, whereby the first transistor and the second transistor couple the magnetic inductor and the at least one capacitance to the static power supply.

9. The circuit of claim 1, wherein the group of other circuits are connected between the dynamic internal power supply node and a return node, and wherein the at least one capacitance includes a shunt capacitance resulting from the group of other circuits.

10. The circuit of claim 1, wherein the other circuits are selected from the group consisting of logic circuits, memory circuits, and circuits having both logic and memory elements.

11. A method for forming an integrated circuit providing a supply voltage, comprising:
forming a first transistor and a second transistor, of different channel types from among N and P channel types, coupled to a static power supply that supplies a constant power supply voltage, the second transistor having two gate terminals connected to a gate terminal of the first transistor; and
forming an on-chip magnetic inductor having a first terminal connected to a common node between the first transistor and the second transistor and a second terminal connected to a dynamic internal power supply node, to supply a dynamic internal power supply node with a boosted voltage relative to the constant power supply voltage by resonating with at least one capacitance coupled to the dynamic internal power supply node.

12. The method of claim 11, further comprising forming a capacitor, different from the at least one capacitance, connected in parallel to the magnetic inductor such that a first terminal of the capacitor is connected to the common node between the first transistor and the second transistor and a second terminal of the capacitor is connected to the dynamic internal power supply node.

13. The method of claim 11, further comprising disabling the first transistor in response to a first phase of a boost clock that is synchronized with a functional clock of the group of other circuits that controls an evaluation for dynamic logic circuits and state changes for static logic circuits in the group of other circuits.

14. The method of claim 13, wherein the magnetic inductor is formed to resonate with the at least one capacitance to supply the dynamic internal power supply node with the boosted voltage, responsive to the first transistor being disabled during a second phase of the boost clock.

15. The method of claim 14, further comprising providing the second phase of the boost clock at a timing corresponding to the evaluation time for the dynamic logic circuits and the state changes for the static logic circuits to provide the boost voltage during the evaluation time and the state changes.

16. The method of claim 11, further comprising:
    coupling the two gate terminals of the second transistor to a boost clock;
    connecting a source terminal of the second transistor to the dynamic internal power supply node; and
    connecting a drain terminal of the second transistor to the static power supply.

17. The method of claim 16, further comprising coupling a source terminal of the first transistor to the source terminal of the second transistor, and a drain terminal of the first transistor to the drain terminal of the second transistor.

18. The method of claim 11, whereby the second transistor is enabled by a first phase of a boost clock and has a source terminal connected to a source terminal of the first transistor, whereby the first transistor and the second transistor couple the magnetic inductor and the at least one capacitance to the static power supply.

19. The method of claim 11, wherein the group of other circuits are connected between the dynamic internal power supply node and a return node, and wherein the at least one capacitance includes a shunt capacitance resulting from the group of other circuits.

20. The method of claim 11, wherein the other circuits are selected from the group consisting of logic circuits, memory circuits, and circuits having both logic and memory elements.

* * * * *